United States Patent
Waldron et al.

(10) Patent No.: US 9,594,125 B1
(45) Date of Patent: Mar. 14, 2017

(54) RACK RECEPTACLE TESTING

(71) Applicant: Amazon Technologies, Inc., Seattle, WA (US)

(72) Inventors: Brien James Waldron, Kennewick, WA (US); Mark Joseph Baracani, Sammamish, WA (US)

(73) Assignee: Amazon Technologies, Inc., Seattle, WA (US)

( * ) Notice: Subject to any disclaimer, the term of this patent is extended or adjusted under 35 U.S.C. 154(b) by 356 days.

(21) Appl. No.: 14/498,138

(22) Filed: Sep. 26, 2014

(51) Int. Cl.
*G01R 31/40* (2014.01)

(52) U.S. Cl.
CPC ..................... *G01R 31/40* (2013.01)

(58) Field of Classification Search
CPC ............. G01N 35/0099; G01N 1/312; G01N 2035/103; H01L 21/6833; G01R 35/005; G01R 31/346; G01R 31/2637; G01R 31/1272
USPC ............ 324/705–713, 600, 647–652, 76.11, 324/76.77–76.83, 500, 750.01–750.02, 324/750.3, 764.01, 543; 340/650, 540, 340/657–662; 361/42, 93.1, 94
See application file for complete search history.

(56) References Cited

U.S. PATENT DOCUMENTS

| | | | |
|---|---|---|---|
| 5,424,588 A | 6/1995 | Cantor et al. | |
| 5,949,247 A | 9/1999 | Lima et al. | |
| 6,833,636 B1 | 12/2004 | Nestel et al. | |
| 8,228,067 B2 | 7/2012 | Conti et al. | |
| 8,823,382 B2 * | 9/2014 | Rondoni | A61N 1/3708 320/134 |
| 8,836,175 B1 * | 9/2014 | Eichelberg | G06F 1/30 307/147 |
| 2005/0134248 A1 | 6/2005 | Locker et al. | |
| 2011/0167282 A1 | 7/2011 | Brown et al. | |

* cited by examiner

*Primary Examiner* — Melissa Koval
*Assistant Examiner* — Trung Nguyen
(74) *Attorney, Agent, or Firm* — Klarquist Sparkman, LLP

(57) ABSTRACT

A rack receptacle loadbank testing system is disclosed for testing a power supply system in a data center from receptacles through a corresponding power distribution unit during both primary and secondary power source conditions. The testing system can include a portable loadbank cart and optionally one or more manual power source switches. The cart can include plural power cords that plug into plural rack receptacles at the same time, and includes a loadbank, a switch for coupling the loadbank to individual power cords, a power analyzer to detect high frequency voltage transients in the power circuitry, and a user interface to control the testing equipment. The power source switch is operable to switch between a first power source feeding the power distribution unit coupled to the rack receptacles, and a second power source feeding the power distribution unit.

20 Claims, 3 Drawing Sheets

SOFTWARE 380 IMPLEMENTING DESCRIBED TECHNOLOGIES

RACK RECEPTACLE TESTING

BACKGROUND

In a data center, server racks are typically provided with power via a plurality of rack receptacles. The receptacles are electrically coupled via one or more whips to a power distribution unit (PDU), which can include a variety of power processing components. The PDU usually receives power from both a primary external power source, and a secondary utility source fed by an alternate distribution—such as a public utility line into the building. However, during a power event/loss on the primary utility source, an automatic transfer switch (ATS) can change the source of power for the PDU to the secondary power source to ensure the electrical equipment remains powered at all times. Both of the incoming primary and secondary utility sources to the PDU may have full redundancy and include an upstream switch which can be fed by either the incoming utility source or a generator, and may further include batteries to back up the power supply during that transition so that there is never an interruption to the power going into the PDU.

DETAILED DESCRIPTION

When a data center power supply system is installed, it is important to adequately test the system to ensure that it is functioning properly before installing server racks and other sensitive computing equipment. Problems in the power supply system can cause damage to the computing equipment and/or can result in power outages that can cause the computing equipment to shut down unexpectedly. Each of the power receptacles into which server racks or other electrical devices are plugged can be tested individually to ensure proper functionality. The individual power supply components, such as receptacles and whips, are typically quality tested in isolation prior to or during installations. However, it is also desirable to perform separate tests of each power circuit of the power supply system when power is supplied by each of the different potential power sources, including any secondary or catcher power sources. This can ensure proper power supply functionality in each of the various power supply scenarios.

Figure 1:
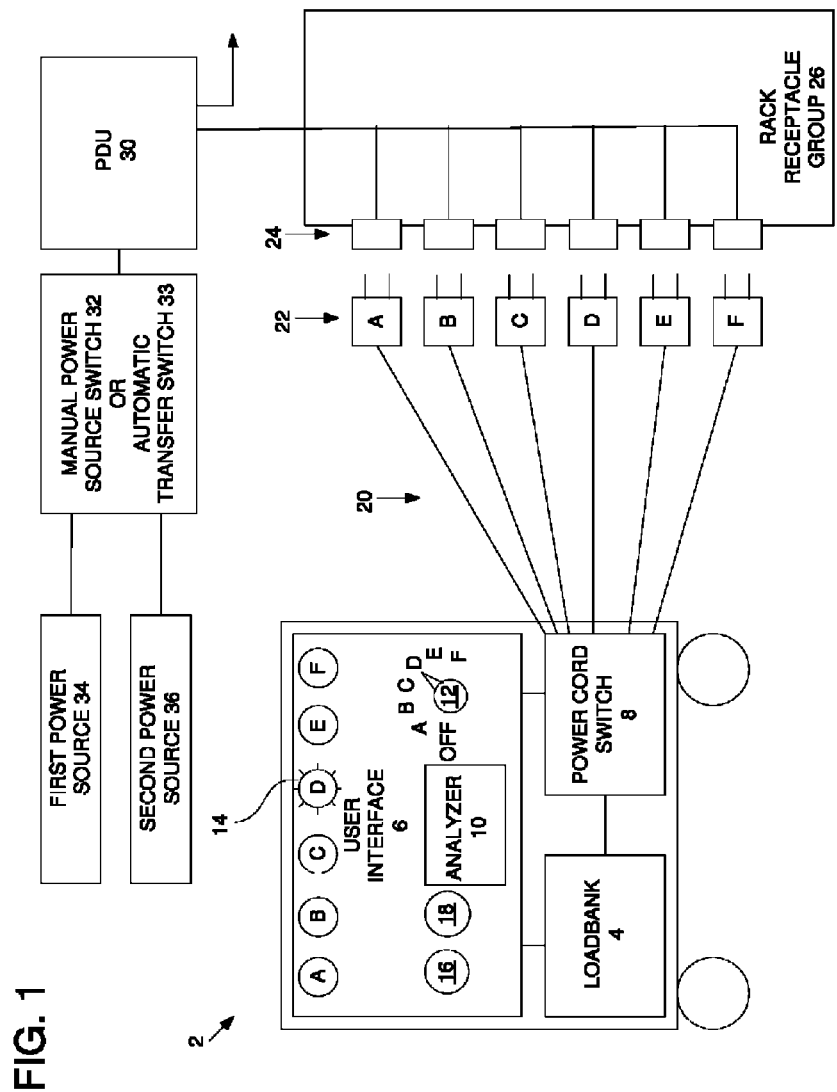
FIG. 1 shows an exemplary testing system for testing a data center power supply system.

FIG. 1 shows an exemplary testing system for testing a data center power supply system. The testing system can comprise a portable loadbank system, which can include a cart or other support that provides for portability about a data center, (referred to generally herein as the "cart 2") and at least one power source switch 32. The power supply system can include one or more rack receptacle groups 26 (only one group is shown for simplicity, though many similar groups may be included), which include a plurality of receptacles 24 that are configured to be electrically coupled to server racks and/or other electrical equipment after the power supply system is adequately tested for proper functionality. The receptacles 24 are electrically coupled via whips and/or other power conduits to a common power distribution unit (PDU) 30. The PDU can include a variety of power processing devices, such as circuit breakers, power monitoring panels, filters, and/or outlets for attaching outgoing and incoming power cables. When finally installed, the PDU can further include or be coupled to an automatic transfer switch (ATS) 33 for automatically switching between incoming power sources. The PDU 30 can be electrically coupled to at least two power sources, such as a primary power source 34 and a secondary power source 36. The primary power source 34 is also sometimes referred to as a critical power source, and the secondary power source 36 is also sometimes referred to as a catcher power source. Additional power sources may also be included. Each of the primary and secondary power sources 34, 36 may include a utility power source entering the facility from an external location, and each may further include a local back-up power source, such as a generator.

In operation, the ATS 33 can be configured to automatically switch between the primary and secondary power sources 34, 36 for providing power to the PDU 30 and on to the rack receptacles 24. However, during the installation of a power supply system, the herein described testing procedures may be carried out before the ATS 33 has been installed. In such cases, at least one manual power source switch 32 can be temporarily installed at or near the PDU 30 and can be user controlled to simulate the switching functionality of an ATS 33 in changing between the available incoming power sources. In some embodiments, more than one manual power source switch 32 is needed to control the power source selection for all of the rack receptacles that are being tested. The one or more manual power source switches 32 can be included with the cart 2 in a testing system. A manual power source switch 32 can include two or more inputs for coupling to the primary and secondary power sources 34, 36 (and optionally other power sources) and one output for coupling to the PDU 30 to supply power. The inputs and outputs of the switch 32 can comprise Phoenix connectors, for example, such as 3 or 6 pin Phoenix connectors.

The portable loadbank cart 2 is configured to apply a simulated power load to the receptacles 24 in order to test the functionality of the power supply system from each respective receptacle 24 through the PDU 30, both when power is supplied from the primary power source 34 and when power is supplied from the secondary power source 36 and/or from other power sources.

The cart 2 can comprise a wheeled frame, or other means of transportation, that supports electrical testing equipment and allows the cart to be portable to different groups of rack receptacles to be tested. The cart 2 can be used test a group of any number of receptacles (e.g., a group of two, six, or ten receptacles) in one testing session, then moved to a new location and used to test a different group of receptacles in a next testing session, and so on. During each testing session, the cart 2 can be physically attached, or plugged into, to the group of receptacles (e.g., rack receptacle group 26 with receptacles 24) by plugging power cords extending from the cart (e.g., cords 20 with respective plugs 22) into the receptacles. Although the plugs 22 are shown spaced from the receptacles 24 in FIG. 1, the plugs 22 are understood to be plugged into the receptacles 24 during testing.

After testing one group of receptacles, the power cords can be unplugged from the receptacles, the cart 2 can be moved to the next location, and the power cords can be plugged into a next group of receptacles. When the groups of receptacles are near enough to each other, the cart 2 may not need to be moved between different testing sessions, and the power cords may simply be unplugged from one group of receptacles and re-plugged into a next group of receptacles with the cart remaining stationary.

When the cart's power cords 20, 22 are unplugged from one group of receptacles and re-plugged into a new group of receptacles, the at least one manual power source switch 32 may also need to be correspondingly detached and reattached to a new location at or near the PDU 30, or a different PDU, for the new group of receptacles such that power source switch 32 is attached to the power circuits for the new group of receptacles.

The cart 2 includes at least one loadbank 4 that is operable to draw a power load. The loadbank may dissipate the drawn power as heat, for example. In some embodiments, the loadbank 4 can be configured to draw one or more predetermined power loads that simulates the power draw of a server rack that is to be attached to the receptacles being tested. In one example, the loadbank is configured to draw about 20 amps or about 5 kilowatts. In some embodiments, two or more loadbanks can be included, such as two or more loadbanks that can be combined to draw a larger total draw that they could individually, or two or more loadbanks that can be used in the alternative to apply different loads and/or different loading patterns to simulate different types of electrical equipment, or two or more loadbanks that can be used to test two different receptacles at the same time or in sequence.

The cart 2 also includes a user interface 6, a power cord selection switch 8, and a power analyzer 10. The power cord selection switch 8 is electrically coupled to the plurality of power cords 20 and electrically coupled to the loadbank 4. The power cord selection switch 8 is operable to electrically couple the loadbank 8 to each of the power cords, one at a time, based on a switch controller 12 located at the user interface 6. An exemplary manual switch controller 12 in the form of a dial is illustrated in FIG. 1, though the switch controller 12 can take many other forms, such as any type of mechanical and/or electronic switch controller.

In the illustrated example, each power cord 20 includes a plug 22 that is labeled A-F, and the switch controller 12 can be rotated to any of a corresponding group of settings A-F, or to an OFF setting wherein none of the power cords 20 are electrically coupled to the loadbank 4. The user interface 6 can optionally also include a group of visual displays 14, such as lights, that illuminate to indicate which of the power cords 20 is currently electrically conducting power to the load bank 4.

The user interface 6 can further comprise one or more loadbank controls, such as to turn the loadbank 4 on or off, or to adjust settings of the loadbank. The exemplary user interface 6 in FIG. 1 includes an on/off switch 16 for turning the loadbank 4 on and off, and a loadbank setting controller 18 for adjusting the settings of the loadbank. For example, the loadbank setting controller 18 can be operable to change the amperage drawn by the loadbank, to change the loading pattern applied by the loadbank, to switch between two or more different loadbanks, and/or to make other loading changes.

The power analyzer 10 can be coupled to the power connection between the loadbank 4 and the power cord selection switch 8, or can be coupled to each of the power cords 20 individually, or otherwise coupled such that the analyzer 10 can measure the power flow to the loadbank 4 for any of the power cords 20. The power analyzer 10 can be a digital device that is operable to measure and record various parameters of the power drawn by the loadbank 4 through the respective receptacle 24 from the PDU 30. Such parameters can include, for example, voltage, amperage, power, frequency, wave shape, and/or other parameters of the power drawn by the loadbank. The analyzer 10 can also be operable to store, display, and/or transmit the measured data for user analysis.

The data measured by the analyzer 10 can be used to determine whether or not the power circuit being tested is functioning properly. In some embodiments, the analyzer 10 can evaluate the system for high frequency transients in the voltage signal. If high frequency transients or noise (i.e., voltage transients) are noted that fall outside of a range which are deemed to be acceptable or normal, then there can be a potential problem with the circuit. This may be an indication of a loose wire or arcing that is occurring during the loading of that particular circuit. Further testing or inspection of that circuit can then be carried out to locate and correct the problematic part of the circuit.

For each power circuit, the loadbank 4 can be applied for a certain period of time (such as about two minutes) while the analyzer 10 measures the power drawn through that particular circuit. In some methods, the cart 2 can load each circuit in a progressively increasing loading pattern. This can reduce the likelihood of welding occurring between loose wires due to a sudden high current of power. Such a weld can result in a false positive test, making the circuit appear to be properly functioning. For example, a progressive two-minute loading pattern can begin with a 40 watt load introduced for 30 seconds, then increase to 750 watt load for 30 seconds, and then a 5000 watt load for the final minute of testing.

The same test can be conducted twice (or more times) for each receptacle: once for each alternative power source. For example, the switch controller 12 can be set to "A" to test the receptacle 24 into which the plug labeled "A" is inserted. A first test can then be conducted with the power source switch 32 set to utilize power from the primary power source 34. The power source switch(es) 32 can then be adjusted (e.g., flipping a switch) to utilize power from the secondary power source 36 and a second test can be conducted on the same receptacle without changing the switch controller 12. In this way, the various components in the PDU and/or ATS cabinet can be tested under both primary and secondary power source supply conditions. The switch controller 12 can be changed to "B" test the next receptacle, and the process can be repeated for each of the six receptacles 24 coupled to power cord plugs A-F.

The cart 2 and/or the power source switch(es) 32 can then be re-connected to a new group of receptacles circuits and the testing can be repeated. Circuit breakers for each power circuit may be turned off while the testing cart and power source switch(es) are re-attached to each new group of circuits.

The data that the analyzer 10 collects can be recorded in combination with other user supplied data. Such data can include, but is not limited to, any combination of the following: the data and time of the test, an identification of the particular receptacle and power circuit tested, the duration of the test, the setting of the loadbank during the test, the type of equipment that is intended to be connected to the tested receptacle, voltage/frequency data measured during the test, whether the tested circuit passed or failed the test, any corrections made to the circuit, and any user comments.

Figure 2:
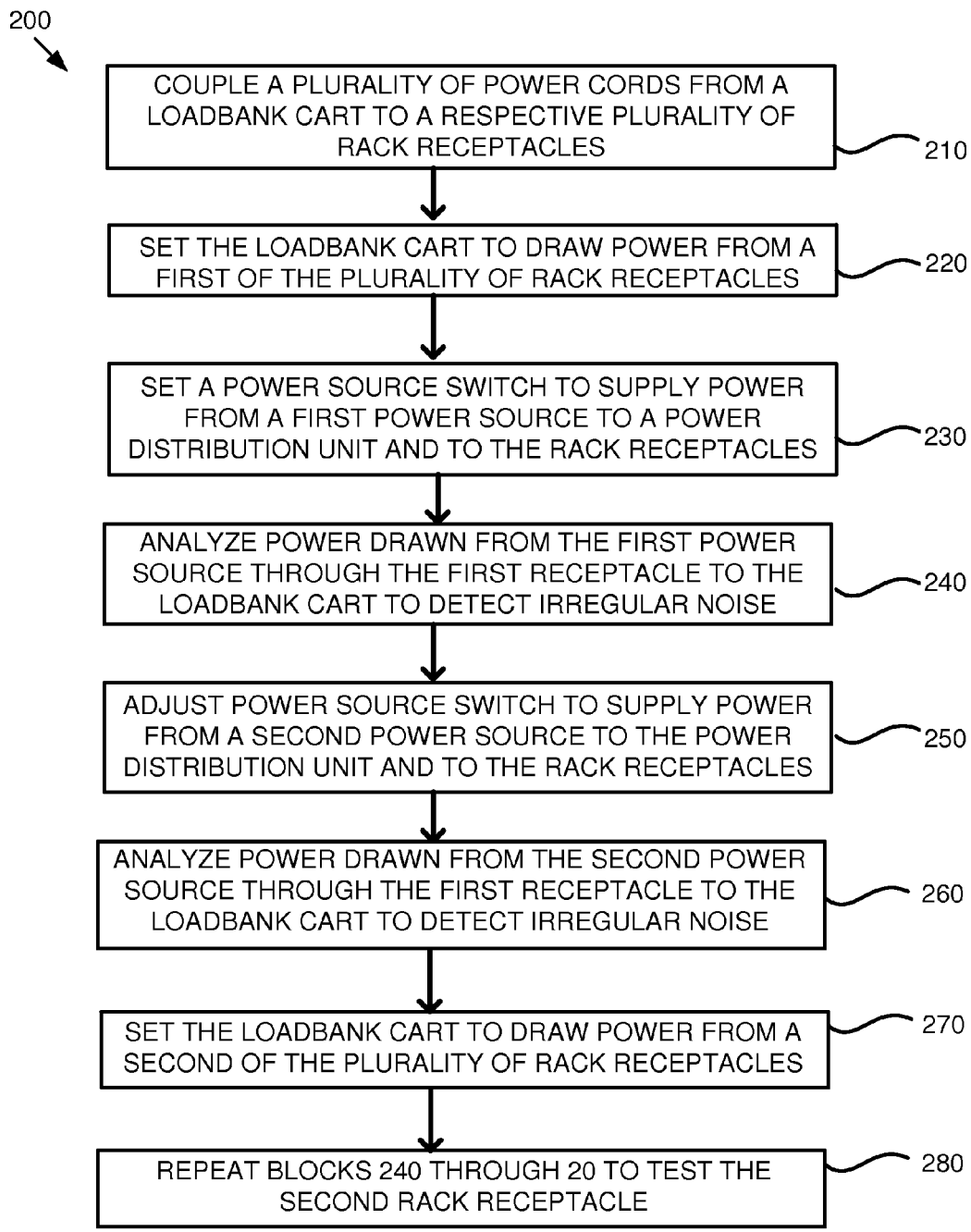
FIG. 2 is a flow chart illustrating an exemplary method for testing a data center power supply system.

FIG. 2 is a flow chart that illustrates an exemplary method 200 for loadbank testing rack receptacles using the cart 2, or similar loadbank cart, and the power source switch 32. At block 210, a plurality of power cords of a loadbank cart are plugged into a corresponding plurality of rack receptacles to be tested. At block 220, a power source switch is coupled to a primary power source and to a secondary power source, and also coupled to a PDU that supplies power to the plurality of rack receptacles to be tested. At block 230, the loadbank cart is set to draw power from a first rack receptacle of the plurality of rack receptacles, such as by adjusting a switching device in the loadbank cart to electrically couple the power cord plugged into the first rack receptacle to a loadbank. At block 240, the power source switch is set such that power is supplied from the first power source to the PDU and on to the plurality of rack receptacles. At block 250, the loadbank draws power through the first rack receptacle from the first power source and the power drawn is analyzed to detect irregular noise in the circuitry. If irregular noise is detected, that circuitry can be further inspected and corrected. At block 260, the power source switch is set such that power is supplied from the second power source to the PDU and on to the plurality of rack receptacles. At bock 270, the loadbank draws power through the first rack receptacle from the second power source and the power drawn is analyzed to detect irregular noise in the circuitry. If irregular noise is detected, that circuitry can be further inspected and corrected. At block 280, the loadbank cart is set to draw power from a second rack receptacle of the plurality rack receptacles. Then, as indicated at block 290, blocks 240-270 can be repeated to test the second rack receptacle. Blocks 240-280 can also be repeated any number of additional times to further test all of the plurality of rack receptacles. The entire method 200 can optionally be repeated to test any number of further groups of rack receptacles. Some of the steps of the method 200 can be performed a different sequence while providing similar results. For example, block 220 can be performed before block 210, and block 240 can be performed before block 230. Further, blocks 240 and 260 can be swapped.

Figure 3:
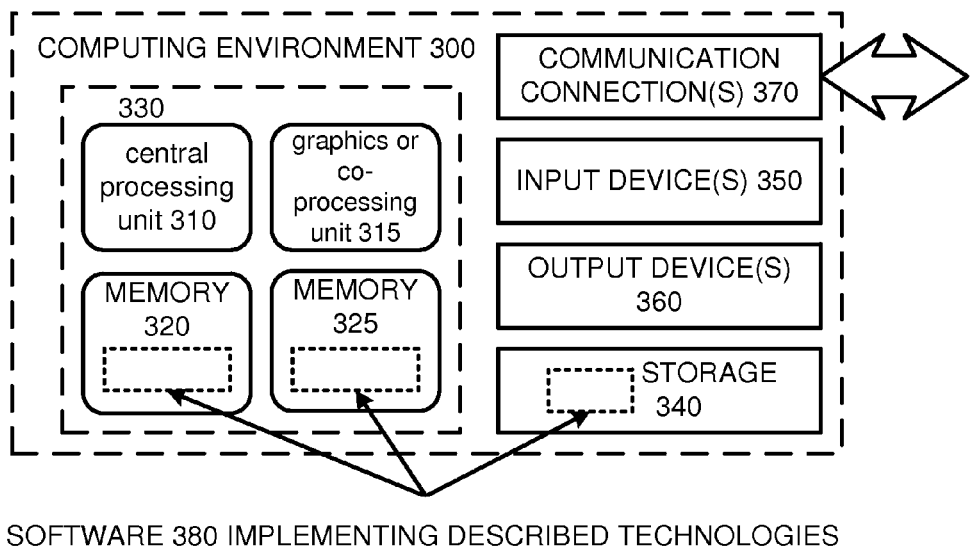
FIG. 3 depicts a generalized example of a suitable computing environment in which the described innovations may be implemented.

FIG. 3 depicts a generalized example of a suitable computing environment 300 in which the described innovations may be implemented. The computing environment 300 is not intended to suggest any limitation as to scope of use or functionality, as the innovations may be implemented in diverse general-purpose or special-purpose computing systems. For example, the computing environment 300 can be any of a variety of computing devices (e.g., desktop computer, laptop computer, server computer, tablet computer, etc.)

With reference to FIG. 3, the computing environment 300 includes one or more processing units 310, 315 and memory 320, 325. In FIG. 3, this basic configuration 330 is included within a dashed line. The processing units 310, 315 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 3 shows a central processing unit 310 as well as a graphics processing unit or co-processing unit 315. The tangible memory 320, 325 may be volatile memory (e.g., registers, cache, RAM), non-volatile memory (e.g., ROM, EEPROM, flash memory, etc.), or some combination of the two, accessible by the processing unit(s). The memory 320, 325 stores software 380 implementing one or more innovations described herein, in the form of computer-executable instructions suitable for execution by the processing unit(s).

A computing system may have additional features. For example, the computing environment 300 includes storage 340, one or more input devices 350, one or more output devices 360, and one or more communication connections 370. An interconnection mechanism (not shown) such as a bus, controller, or network interconnects the components of the computing environment 300. Typically, operating system software (not shown) provides an operating environment for other software executing in the computing environment 300, and coordinates activities of the components of the computing environment 300.

The tangible storage 340 may be removable or non-removable, and includes magnetic disks, magnetic tapes or cassettes, CD-ROMs, DVDs, or any other medium which can be used to store information in a non-transitory way and which can be accessed within the computing environment 300. The storage 340 stores instructions for the software 380 implementing one or more innovations described herein.

The input device(s) 350 may be a touch input device such as a keyboard, mouse, pen, or trackball, a voice input device, a scanning device, or another device that provides input to the computing environment 300. The output device(s) 360 may be a display, printer, speaker, CD-writer, or another device that provides output from the computing environment 300.

The communication connection(s) 370 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed technology may be applied, it should be recognized that the illustrated embodiments are only preferred examples and should not be taken as limiting the scope of the disclosure. Rather, the scope of the disclosure at least as broad as the following claims. I therefore claim all that comes within the scope of these claims.

What is claimed is:

1. A testing system for loadbank testing of a power supply system in a data center, the power supply system including a power distribution unit and server rack receptacles being electrically coupled to the power distribution unit, the testing system comprising:
    a portable loadbank cart that includes:
        a frame adapted for portability within a data center;
        a loadbank supported by the frame;
        a plurality of power cords configured to attach to a corresponding number of the rack receptacles;
        a power cord selection switch electrically coupled to the loadbank and electrically coupled to each of the power cords, the power cord selection switch operable to electrically connect the loadbank to each of the power cords, one at a time, such that the loadbank is configured to draw power through a selected one of the power cords from a respective rack receptacle; and
        a power analyzer electrically coupled between the loadbank and the power cord selection switch, the power analyzer being operable to measure voltage of power flowing between the selected power cord and the loadbank to detect high frequency transients in the voltage;
    wherein the testing system is operable to loadbank test the data center power supply system from the rack receptacles through the power distribution unit, both when power is supplied to the power distribution unit from a first power source and when power is supplied to the power distribution unit from a second power source.

2. The testing system of claim 1, further comprising at least one manual power source switch that includes:
    a first power source input configured to be electrically coupled to the first power source;
    a second power source input configured to be electrically coupled to the second power source;
    a power output configured to be electrically coupled to the power distribution unit that supplies power to the rack receptacles coupled to the power cords; and
    a controller operable to switch between a first setting wherein the first power source input is electrically coupled to the power output and a second setting wherein the second power source input is electrically coupled to the power output.

3. The testing system of claim 2, wherein the at least one power source switch is configured to manually simulate functionality of an automatic transfer switch.

4. The testing system of claim 2, wherein the at least one power source switch is adapted to be temporarily attached to the data center power supply system during the loadbank testing, and then removed after the loadbank testing, such that the at least one power source switch is not included in the data center power supply system during normal operation of the data center.

5. The testing system of claim 1, wherein the portable loadbank cart comprises six or more power cords coupled to the power cord selection switch and operable to be coupled to six or more rack receptacles.

6. The testing system of claim 1, wherein the power analyzer is operable to record or store data corresponding the measured voltage.

7. The testing system of claim 1, wherein the testing system is operable to successively loadbank test a plurality of rack receptacles without unplugging any of the power cords from any rack receptacles.

8. The testing system of claim 1, wherein the power cord selection switch can be set such that none of the power cords is electrically coupled to the loadbank.

9. The testing system of claim 1, wherein the portable loadbank cart includes a user interface that comprises a control for the power cord selection switch, a control for the loadbank, and a display of the power analyzer.

10. A method for loadbank testing rack receptacles in a data center, the method comprising:
    coupling a plurality of power cords from a loadbank cart to a respective plurality of rack receptacles in a data center;
    setting the loadbank cart to draw power from a first rack receptacle of the plurality of rack receptacles through a first of the plurality of power cords;

setting a power source switch to supply power from a first power source for the data center to a power distribution unit, which supplies power to the plurality of rack receptacles;

analyzing power drawn by the loadbank cart from the first power source through the first rack receptacle to detect high frequency transients in the voltage of the drawn power;

adjusting the power source switch to supply power from a second power source for the data center to the power distribution unit and the plurality of rack receptacles;

analyzing power drawn by the loadbank cart from the second power source through the first rack receptacle to detect high frequency transients in the voltage of the drawn power;

adjusting the loadbank cart to draw power from a second rack receptacle of the plurality of rack receptacles through a second of the plurality of power cords;

analyzing power drawn by the loadbank cart from the first power source through the second rack receptacle to detect high frequency transients in the voltage of the drawn power; and analyzing power drawn by the loadbank cart from the second power source through the second rack receptacle to detect high frequency transients in the voltage of the drawn power.

11. The method of claim 10, wherein the power source switch is a manual power source switch, and the method further comprises coupling the manual power source switch to the first and second power sources for the data center and to the power distribution unit to simulate the functionality of an automatic transfer switch.

12. The method of claim 11, further comprising decoupling the manual power source switch from the power distribution unit and re-coupling the manual power source switch to another power distribution unit to loadbank test another group of rack receptacles fed by the another power distribution unit.

13. The method of claim 10, further comprising recording or storing data corresponding to voltages measured by the power analyzer.

14. The method of claim 10, wherein the plurality of power cords remain coupled to the respective rack receptacles while both the first and second rack receptacles are loadbank tested.

15. The method of claim 10, wherein analyzing power drawn by the loadbank cart from the first power source through the first rack receptacle comprises applying a power load that simulates a power load drawn by a server rack.

16. The method of claim 10, wherein analyzing power drawn by the loadbank cart from the first power source through the first rack receptacle comprises monitoring high frequency transients in the voltage while viewing a display on a user interface of the loadbank cart.

17. A portable loadbank tester for loadbank testing a power supply system in a data center, the data center power supply system including a power distribution unit and server rack receptacles electrically coupled to the power distribution unit, the portable loadbank tester comprising:

a loadbank;

a plurality of power cords configured attach to a corresponding number of the rack receptacles;

a power cord selection switch electrically coupled to the loadbank and electrically coupled to each of the power cords, the power cord selection switch operable to electrically connect the loadbank to each of the power cords, one at a time, such that the loadbank is operable to sequentially draw power through each of the plurality of power cords from the respective rack receptacles; and a power analyzer electrically coupled between the loadbank and the power cord selection switch, the power analyzer being operable to measure voltage of power flowing between the selected power cord and the loadbank to detect high frequency transients in the voltage;

wherein the portable loadbank tester is operable to loadbank test the data center power supply system from the rack receptacles through the power distribution unit; and wherein the portable loadbank tester is operable to successively loadbank test a plurality of rack receptacles in sequence while each of the plurality of power cords remain attached to the respective rack receptacles.

18. The testing system of claim 17, wherein the portable loadbank tester comprises six or more power cords coupled to the power cord selection switch and operable to be coupled to six or more respective rack receptacles at the same time.

19. The testing system of claim 17, wherein the power analyzer is operable to record or store data corresponding to the measured voltage.

20. The testing system of claim 17, wherein the power cord selection switch is operable to be set such that none of the power cords are electrically coupled to the loadbank.

* * * * *